(12) United States Patent
Desclos

(10) Patent No.: US 7,020,450 B2
(45) Date of Patent: Mar. 28, 2006

(54) ACTIVE INDUCTORS USING BIPOLAR SILICON TRANSISTORS

(75) Inventor: Laurent Desclos, Princeton, NJ (US)

(73) Assignee: NEC Corporation, Tokyo (JP)

( * ) Notice: Subject to any disclaimer, the term of this patent is extended or adjusted under 35 U.S.C. 154(b) by 697 days.

(21) Appl. No.: 09/816,346

(22) Filed: Mar. 26, 2001

(65) Prior Publication Data

US 2002/0028660 A1    Mar. 7, 2002

Related U.S. Application Data

(60) Provisional application No. 60/229,551, filed on Sep. 5, 2000.

(51) Int. Cl.
*H04B 1/26* (2006.01)
*H03B 19/00* (2006.01)

(52) U.S. Cl. .............. 455/313; 455/323; 455/330; 455/333; 327/113; 327/118; 327/122; 327/327

(58) Field of Classification Search .............. 455/73, 455/75, 76, 84, 85, 86, 118, 126, 127, 128, 455/313, 319, 321, 323, 341, 308, 326, 330, 455/333; 327/199, 306, 309, 327, 113, 110, 327/118–122, 139, 168, 325, 519, 552, 560, 327/562

See application file for complete search history.

(56) References Cited

U.S. PATENT DOCUMENTS

| 3,569,732 | A | * | 3/1971 | Christensen | 327/122 |
| 3,624,514 | A | * | 11/1971 | Putzer | 455/180.4 |
| 3,993,962 | A | * | 11/1976 | Hopwood et al. | 331/18 |
| 4,262,361 | A | * | 4/1981 | Hauer | 455/113 |
| 4,701,646 | A | * | 10/1987 | Richardson | 326/117 |
| 4,829,204 | A | * | 5/1989 | Harris et al. | 327/113 |
| 4,864,644 | A | * | 9/1989 | Takahashi et al. | 455/326 |
| 5,151,669 | A | * | 9/1992 | Roques et al. | 333/81 R |
| 5,170,500 | A | * | 12/1992 | Broderick | 455/315 |
| 5,563,612 | A | * | 10/1996 | Flood et al. | 342/385 |
| 5,649,312 | A | * | 7/1997 | Kennan | 455/333 |
| 5,726,613 | A | * | 3/1998 | Hayashi et al. | 333/214 |
| 5,821,825 | A | * | 10/1998 | Kobayashi | 331/66 |
| 5,826,183 | A | * | 10/1998 | Apel | 455/326 |

(Continued)

OTHER PUBLICATIONS

See S. Wu, B. Razavi, "A 900 MHz/1.8 GHz CMOS Receiver for Dual Band Applications," IEEE ISSCC Symposium, San Francisco, Feb. 5-7, 1998, p. 124-125.

(Continued)

*Primary Examiner*—Duc M. Nguyen
(74) *Attorney, Agent, or Firm*—Sughrue Mion, PLLC

(57) ABSTRACT

An active inductor includes bipolar transistors T1, T2, T3 and TD (TD being arranged in diode), where T1's emitter is connected to an output port and to T2's collector. T2's base is connected to a first voltage line and between two connected capacitors. T2's emitter is connected to T3's collecter. An end of one capacitor is connected to T1's base and to a second voltage line. An end of the other capacitor is connected to T3's emitter and to a third voltage line. T1's collector is connected to a fourth voltage line and to TM's collecter, which is connected to TM's base. TM's emitter is electrically connected to T3's base. Preferably, the transistors T1–T3 and TD are Silicon based, and the active inductor is fabricated on a single substrate comprising Silicon. The active inductor is incorporated into adaptive oscillators and amplifiers and an improved transceiver.

22 Claims, 25 Drawing Sheets

U.S. PATENT DOCUMENTS

| | | | |
|---|---|---|---|
| 5,930,695 A * | 7/1999 | Yamaguchi et al. | 455/308 |
| 6,066,993 A * | 5/2000 | Yamamoto et al. | 333/103 |
| 6,198,352 B1 * | 3/2001 | Tanji | 330/302 |
| 6,211,708 B1 * | 4/2001 | Klemmer | 327/122 |
| 6,211,753 B1 * | 4/2001 | Leifso et al. | 333/214 |
| 6,282,252 B1 * | 8/2001 | Fushimi | 375/346 |
| 6,515,560 B1 * | 2/2003 | Adan | 333/214 |
| 6,737,944 B1 * | 5/2004 | Kunikiyo | 333/214 |

OTHER PUBLICATIONS

M. Madihian, et al., "A 5-GHz-Band Multifunctional BiCMOS Transceiver Chip for GMSK Modulation Wireless Systems," IEEE Journal of Solid-State Circuits, vol. 34, No. 1, Jan. 1999, pp. 25-32.

S. Hara, et al., "Lossless Broad-Band Monolithic Microwave Active Inductors," IEEE Transactions on Microwave Theory and Techniques, vol. 37, No. 12, Dec. 1989, pp. 1979-1984.

* cited by examiner

ACTIVE INDUCTORS USING BIPOLAR SILICON TRANSISTORS

This application claims the benefit of U.S. provisional Application No. 60/229,551, filed Sep. 5, 2000.

FIELD OF THE INVENTION

The present invention relates to active inductors for use in monolithic circuit design for wireless communication systems and, more particularly, to the use of active inductors in silicon based devices. The inductors are adaptive, permitting adjustment of both inductive value and quality factor characteristics.

BACKGROUND OF THE INVENTION

Wireless and data communication system use continues to increase, creating an ever-growing need to exploit all available frequency bands. Starting at 900 MHz GSM bands, 1800 MHz DCS bands, and 2.4 GHz/5 GHz LAN bands, the quest for additional band width permitting higher speed data transfer is on going. Ultimately, it may be necessary to have a front end that will be automatically reconfigured, in response to the demand for the requested service or the overall traffic congestion. Ideally, the reconfiguration would occur automatically, without any input from the user.

One of the challenges to achieving an automatically reconfigurable front end is the need for a wide range of characteristics over a wide frequency range within a global circuit configuration. Attempts have been initiated in dual frequency, but often assuming that one frequency is double the other. See S. Wu, B. Razavi, "A 900 MHz/1.8 GHz CMOS Receiver for Dual Band Applications," IEEE ISSCC Symposium, San Francisco, 5–7 Feb. 1998, p. 124–125. As such, the previously proposed configurations would not provide the desired unconditional multimode front end.

In addition a 5 GHz-band multifunctional BiCMOS transceiver chip for gaussian minimum-shift keying (GMSK) modulation wireless systems has previously been proposed. See M. Madihian, T. Drenski, L. Desclos, H. Yoshida, H. Hirabayashi, T. Yamazaki, "A 5 GHz Band Multifunctional BiCMOS Transceiver Chip for GMSK Modulation Wireless Systems," IEEE Journal of Solid State Circuits, vol. 34, No. 1, January 1999, pages 25–32. One shortcoming of the proposed transceiver is that it is limited to a specific frequency band. In addition, the disclosed transceiver lacks versatility because it doesn't include means for providing different matching for the input and output of its constituent amplifiers for different frequencies.

Active inductors are one possibility for providing adaptive matching. In the field of circuit design, several types of inductors are used. Generally, inductors can be classified as passive or active. FIG. 1 shows an example of a passive inductor. A first metal layer ML1 having a width w is represented by the dark region and a second metal layer ML2 having a width is depicted by the white region. The two widths w and s and the four lengths L1, L2, L3 and L4 determine the value of the inductance and the quality factor, thereby fixing the values of these two physical parameters. One shortcoming of passive inductors is that they are often limited in quality factor (Q) by the metal layer thickness, the relative permitivity of the oxide, and losses through the substrate. Typical inductance and quality factor values are several nano Henry and a Q of 5, respectively. Suppression of losses and high inductance values can only be achieved in these passive inductors by resort to a more complex process. For example, one possibility is to remove the Silicon under the passive inductor. However, even if the passive inductor's quality factor and inductance increase, these values are fixed based on the physical characteristics of the passive inductor.

In order to provide a versatile means for adjusting inductance, several researchers have proposed the concept of active inductors. Several examples of such artificial active inductors have been proposed in the literature, and one of the most common was proposed by Hara. See S. Hara, T. Tokumitsu, M. Aikawa, "Lossless Broadband Monolithic Microwave Active Inductors", IEEE Trans on MTT, vol 37, n 12, December 1989. These active inductors are essentially formed of transistors, capacitors and resistors. Under several assumptions based on the transistor model, the equivalent circuit behaves like an inductor.

The structure proposed by Hara is depicted in FIG. 2 and includes three transistors T1, T2, T3, which are connected as follows.

As shown in FIG. 2, an emitter of the transistor T1 is connected to an output port Vout and connected to a collector of the transistor T2. A base of the transistor T2 is connected to a voltage supply VS 1, as well as between two capacitors C1 and C2 which are connected together. An emitter of the transistor T2 is connected to a collector of the transistor T3.

An end of capacitor C2, which is not connected to the base of transistor T2, is connected to a base of T1 and to a voltage supply VS2. An end of capacitor C1, which is not connected to the transistor T2, is connected to an emitter of T3, to a voltage supply VS3, and to a load L1 which consists of a capacitor and resistor.

A collector of the transistor T1 is connected to a voltage supply VS4 and a capacitor C11. The other end of the capacitor C11 is connected to the base of T3 and to a voltage supply VS5. In the circuit illustrated in FIG. 2, the capacitor C11 is used as a DC buffer between the two transistors T1 and T3.

One of the drawbacks of the structure illustrated in FIG. 2 is that it uses a Direct Current Cut capacitor C11 in the loop of the structure. From an Alternate Current perspective, the losses occurring in the loop are critical for good performance. Therefore, in silicon based devices, the losses occurring in the capacitors, especially in the case of MIM capacitors, are so high that they prohibit the formation of an active inductor for the structure illustrated in FIG. 2. Thus, in order to use the active inductor illustrated in FIG. 2, one must minimize the capacitor C11 in order to minimize leakage into the substrate and the corresponding destruction of the inductive effect. On the other hand, if the capacitor C11 is not large enough, it will act as a high pass filter. As a result, the inductive effect can be achieved using the circuit illustrated in FIG. 2 only at high frequencies, typically around 10 GHz. However, the current state of bipolar technology using Silicon is not capable of attaining such high frequencies. Because the gain of the equivalent inductive element is dependent upon the gain and the parasitic elements of the constituent bipolar transistors, it is almost impossible to realize active inductors on Silicon substrate for intermediate and low frequencies (1 GHz to 6 GHz).

OBJECTS OF THE INVENTION

Accordingly, one objective of the present invention is to improve upon existing designs, in order to permit fabrication of active inductors employing a conventional silicon process for low and intermediate frequencies.

In addition, communication systems may in the future require a versatility that could be achieved using a multi-frequency arrangement. The provision of this multi-frequency feature is critical for the development of multimode systems that work in different frequency bands. Accordingly, a second objective of the present invention is to provide an active inductor on a Silicon substrate that can be employed at low to intermediate frequencies, ranging from 1–7 GHz.

A third objective of the present invention is to provide an improved amplifier incorporating active inductors.

In addition the present invention has, as a fourth objective, providing an improved transceiver that is operable over a wide range of frequencies and can be reconfigured for a multimode application.

SUMMARY OF THE INVENTION

These and other objectives are achieved by providing an active inductor including a first and a second capacitance, each having a first and a second end, as well as a first, a second, a third, and a fourth voltage line. Preferably, the capacitances are provided by capacitors.

The active inductor further includes a first, a second, and a third transistive element, where each transistive element has an input, an output, and a control. Preferably, the transistive elements are transistors, and more preferably, bipolar transistors, where the input, output, and control are provided by a collector, and emitter, and a base, respectively.

In addition, the active inductor includes a nonlinear circuit element comprising an input and an output. Preferably, the nonlinear circuit element is a transistor arranged in diode, and more preferably a bipolar transistor arranged in diode, where the input and output are provided by a collector and an emitter, and further including a base which is connected to the collector.

The active inductor is configured as follows. The output of the first transistive element is electrically connected to an output port and to the input of the second transistive element. The control of the second transistive element is electrically connected to the first voltage line and to the first ends of the first and second capacitances, which are electrically connected together.

The output of the second transistive element is electrically connected to the input of the third transistive element. The second end of the second capacitance is electrically connected to the control of the first transistive element and to the second voltage line. The second end of the first capacitance is electrically connected to the output of the third transistive element and to the third voltage line.

The input of said first transistive element is electrically connected to the fourth voltage line and to the input of the nonlinear circuit element. The output of the nonlinear circuit element is electrically connected to the control of the third transistive element.

In a second aspect, the active inductor further includes a fifth voltage line, which is electrically connected to the output of the nonlinear circuit element and to the control of the third transistive element.

In a third aspect, the active inductor, further includes a first, second, third, and fourth voltage supply, where each voltage supply is electrically connected to the respective voltage line.

In a fourth aspect, the transitive elements and nonlinear circuit elements are Silicon based bipolar transistors, and the capacitances are provided by capacitors. More preferably, the active inductor is fabricated on a single substrate, which preferably comprises Silicon.

A fifth aspect is similar to the fourth aspect, except the active inductor further includes first, second, third, fourth, and fifth voltage supplies, each voltage supply being connected to the respective voltage lines.

A second embodiment of the present invention provides an oscillator having an RLC circuit in a feedback loop. The RLC circuit includes a capacitive element and an active inductor of the first embodiment, which are electrically connected to one another. Preferably, the capacitive element is a capacitor.

A third embodiment of the present invention provides an adaptive amplifier including at least one amplification stage having an input and an output, and an input and an output active matching element. The matching elements include an active inductor of the first embodiment. The input matching element is electrically connected to the input of the amplification stage, and the output matching element is electrically connected to the output of the amplification stage.

In a second aspect, the adaptive amplifier includes at least two amplification stages, with each amplification stage having at least one Field Effect Transistor (FET). More preferably, the adaptive amplifier includes a first and a second amplification stage, where the first stage includes three Metal Oxide Semiconductor FET's (MOSFET's), and the second stage includes one MOSFET, with each MOSFET having a gate length of about 300 μm.

A third aspect is similar to the second aspect, with the adaptive amplifier also including at least one interior active inductor which is positioned between the first and second amplification stages. More preferably, at least two interior active inductors are positioned between the first and second stages.

A fourth embodiment of the present invention provides an improved transceiver including a first adaptive amplifier, a first mixer having an active load, and a first intermediate frequency amplifier. The output of the first adaptive amplifier is input to the first mixer, which is also provided with a reference signal. The output of the first mixer is input to the first intermediate frequency amplifier.

In a second aspect, the transceiver further includes a second intermediate frequency amplifier, and a limiter including an active load. The transceiver further includes a second mixer having an active load, in which the output of the limiter is input. The reference signal provides a second input to the second mixer. In addition, the transceiver includes a second adaptive amplifier. The output of the second intermediate frequency amplifier is input to the limiter, and the output of the second mixer is input to the second adaptive amplifier.

In a third aspect, the transceiver further includes a doubler, which has an active by-pass switch, and a buffer amplifier outputting a reference signal to the first and second mixers. The output of the doubler is input to the buffer amplifier.

A fourth aspect provides a transceiver including an intermediate frequency amplifier, a limiter having an active load, a mixer having an active load, and an adaptive amplifier. The output of the intermediate frequency amplifier is input to the limiter. The output of the limiter is input to the mixer, which is also provided with a reference signal. The output of the mixer is input to the adaptive amplifier.

Preferably, adaptive amplifiers of the third embodiment are employed.

The preferred mixer has a first input with a first frequency $f_1$ and a second input with a second frequency $f_2$. The mixer includes mixing means for mixing the first and second inputs to produce an output having an additive frequency component $f_+=f_1+f_2$ and a difference frequency component $f_-$=absolute value $(f_1-f_2)$. The mixer also includes an active load comprising a Field Effect Transistor (FET), the load being electrically connected to the mixing means to provide a variable load thereon. More preferably, the FET is a MOSFET.

The preferred doubler includes doubling means for outputting an output frequency which is double an input frequency and a by-pass switch including a FET. The by-pass switch bypasses the doubling means upon application of a switching gate voltage to the FET causing the output frequency to be equal to the input frequency. Preferably, the FET is a MOSFET.

BRIEF DESCRIPTION OF THE DRAWINGS

The invention and advantageous refinements thereof are explained in more detail below with the aid of diagrammatic, exemplary embodiments in the drawings, in which.

DETAILED DESCRIPTION OF THE PREFERRED EMBODIMENT

Figure 1:
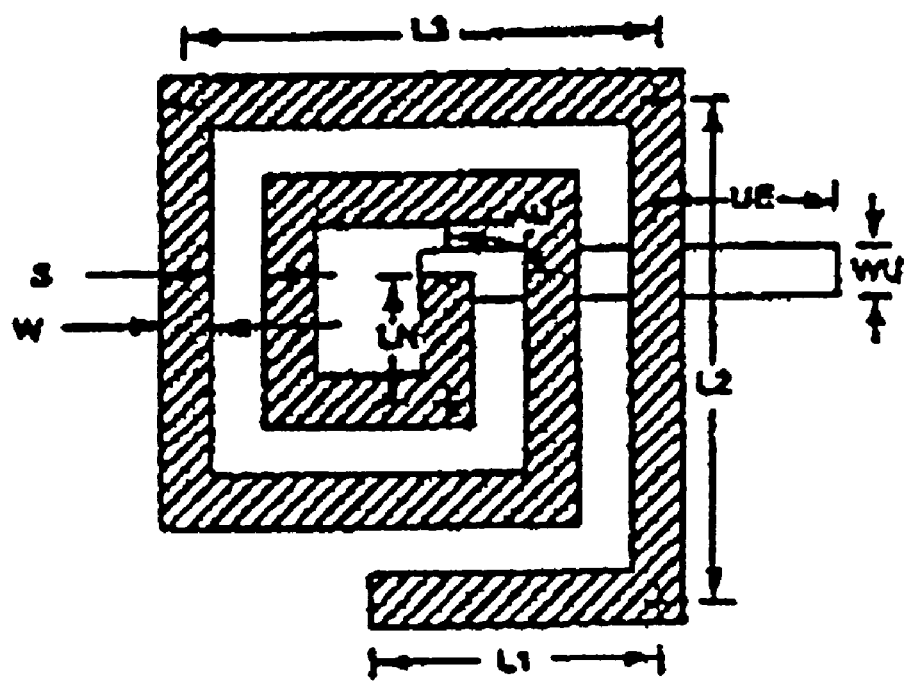
FIG. 1 shows a top view of a typical passive Silicon inductor.
Figure 2:
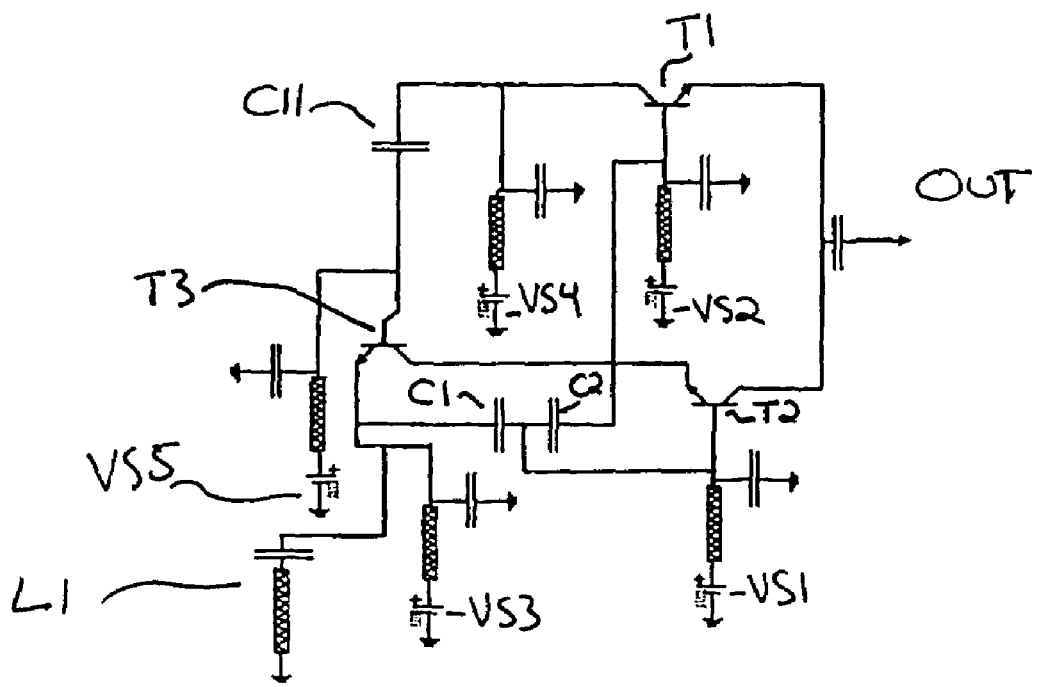
FIG. 2 depicts an arrangement of bipolar transistors, resistors, and capacitors having an equivalent circuit which is predicted to behave like an inductor, under several assumptions based on the transistor model.
Figure 3:
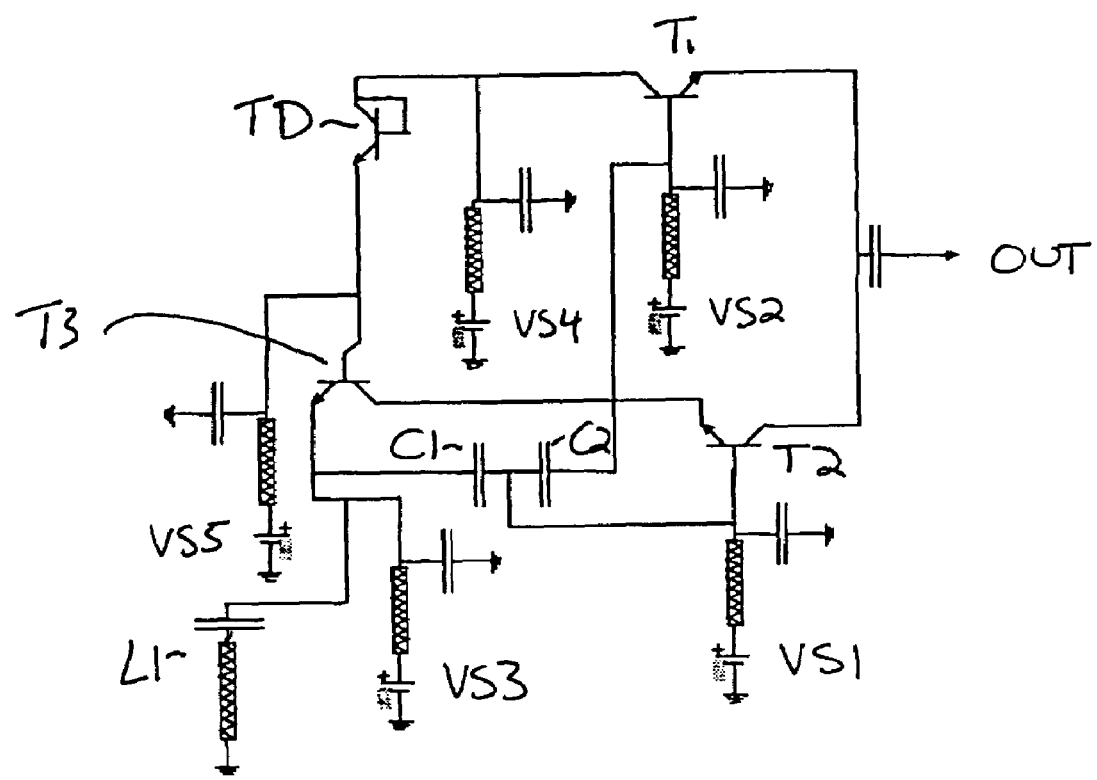
FIG. 3 illustrates an active inductor according to a first embodiment of the present invention.

FIG. 3 depicts an active inductor according to a first embodiment of the present invention. For simplicity, the same reference numbers are used to identify similar elements. The active inductor illustrated in FIG. 3 includes four transistors T1, T2, T3, and TD, which are connected as follows.

An emitter of a first transistor T1 is connected to an output port Vout and to a collector of a second transistor T2. A base of the second transistor T2 is connected to a voltage supply VS1 and between a first and a second capacitor C1 and C2, which are connected together.

An emitter of the second transistor T2 is connected to a collector of a third transistor T3.

An end of the second capacitor C2, which is not connected to the base of the second transistor T2, is connected to a base of the first transistor T1 and to a voltage supply VS2. An end of the first capacitor C1, which is not connected to the second transistor T2, is connected to an emitter of T3, to a voltage supply VS3, and to a load L1. The load L1 is depicted as including a capacitor $C_{load}$ and a resistor $R_{load}$. However, the load L1 is exemplary and is more generally understood as a load with a complex impedance. A collector of the first transistor T1 is connected to a voltage supply VS4 and to a base of a fourth transistor TD, which is arranged in diode. Namely, a base and a collector of the transistor TD are connected together. An emitter of the transistor arranged in diode TD is connected to the base of T3 and to a voltage supply VS5.

Simulations were performed for the active inductor of the first embodiment with an electronic simulator using a classical bipolar model. The results of the simulations, which are depicted in FIGS. 4 and 5, determined that the inductive values and the frequency related Q factor could be adjusted over ranges of 0.5 GHz to 4 GHz and 5 to 50, respectively.

Figure 4:
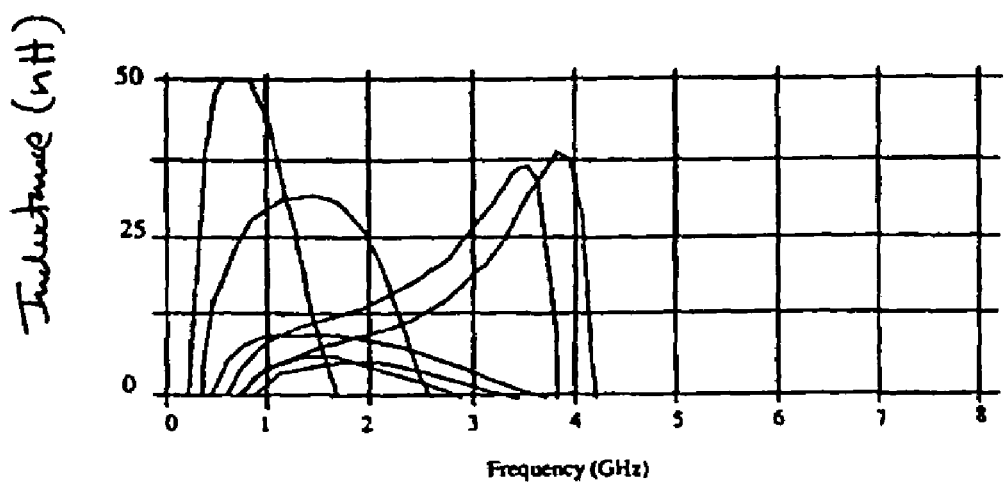
FIG. 4 shows the equivalent inductance as a function of frequency plotted for different values of the voltage VS2, for the active inductor depicted in FIG. 3.

FIG. 4 shows the equivalent inductance as a function of frequency for different values of the voltage VS2, which is applied to the base of the first transistor T1. As seen from FIG. 4, equivalent inductances between 5–50 nH can be achieved, by varying the voltage VS2.

Figure 5:
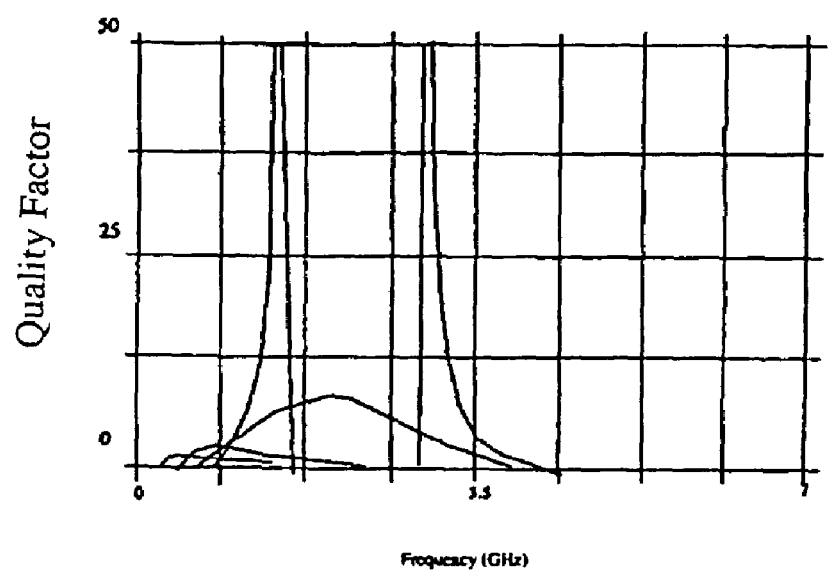
FIG. 5 shows the Q factor as a function of frequency plotted for different values of the voltage VS4, for the active inductor depicted in FIG. 3.

FIG. 5 shows the equivalent Q factor as a function of frequency for different values of the voltage VS4, which is applied on the base of the third transistor T3. As seen from FIG. 5, equivalent Q factors between 5–50 can be achieved by varying the voltage VS4.

Optimization of the active inductor of embodiment 1 of the present invention requires adjustment of the voltages VS1–VS5. Preferably, VS2 and VS4 are adjusted to reduce the equivalent resistance $R_{eq}$. Preferably, VS3 and VS5 are adjusted to shift the optimal frequency. More preferably, the optimal frequency is achieved by simultaneously adjusting VS2 and VS4, provided that VS1, VS3, and VS5 are adjusted to match the biasing points of the four transistors T1–T3 and TD.

The active inductors of the present invention are not limited to any specific applications and practitioners will readily recognize that the active inductors can be used wherever a passive inductor is used. However, exemplary applications are provided to demonstrate the use of the active inductors in oscillators, amplifiers, and transceivers.

In actual communications systems, the use of oscillators to stabilize the working frequency is essential. A central component of most oscillators is an RLC circuit. Although the active inductors of the present invention can be advantageously incorporated in a large number of RLC circuits, it would be burdensome to enumerate these RLC circuits because the name of each circuit changes based upon the placement of the feedback loop and based upon the type of RLC filter. Accordingly, only a few illustrative examples are provided of circuits advantageously incorporating the active inductors of the present invention.

Figure 6:
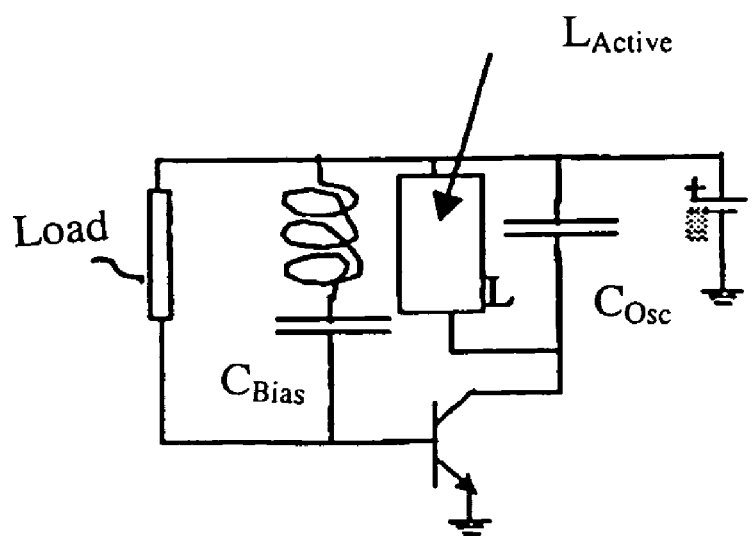
FIG. 6 depicts an exemplary oscillator according to a second embodiment of the present invention which includes an active inductor.

A second embodiment of the present invention provides an adaptive oscillator, one example of which is illustrated in FIG. 6. The oscillator shown in FIG. 6 includes an HF amplifier with an accorded load, in which part of the output signal is re-injected in the input of the oscillator with the correct phase due to the correct transformation of a secondary self. The inductor $L_{active}$ is an active inductor of the present invention. In the exemplary oscillator depicted in FIG. 6, the capacitor $C_{osc}$ suppresses the biasing perturbation from the output (provided that the impedance at the working frequency is negligible). The desired frequency is determined via the filtering effect of the LC factor. Namely, the active inductor $L_{active}$ acts in parallel with the capacitor $C_{osc}$ to provide a filtering effect at a certain frequency with a high quality factor, thereby achieving a pure signal. Further, because the active inductor $L_{active}$ is a variable inductor, a direct means for optimizing the frequency is provided.

Figure 7:
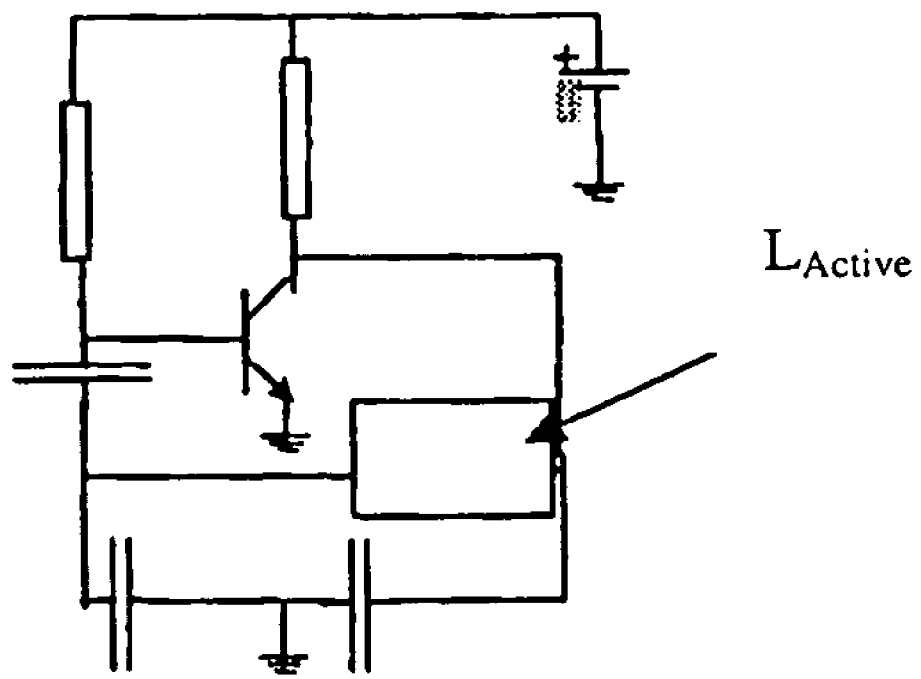
FIG. 7 depicts a Colpitz oscillator which includes an active inductor.

An often used oscillator is the Colpitz type. The essential part of the Colpitz structure is the feedback loop, which includes an RLC type filter. These structures are also often employed to characterize the quality factor of inductors. FIGS. 7 illustrates a second example of the second embodiment, namely a Colpitz oscillator, which includes an active inductor $L_{active}$ of the present invention.

Figure 8:
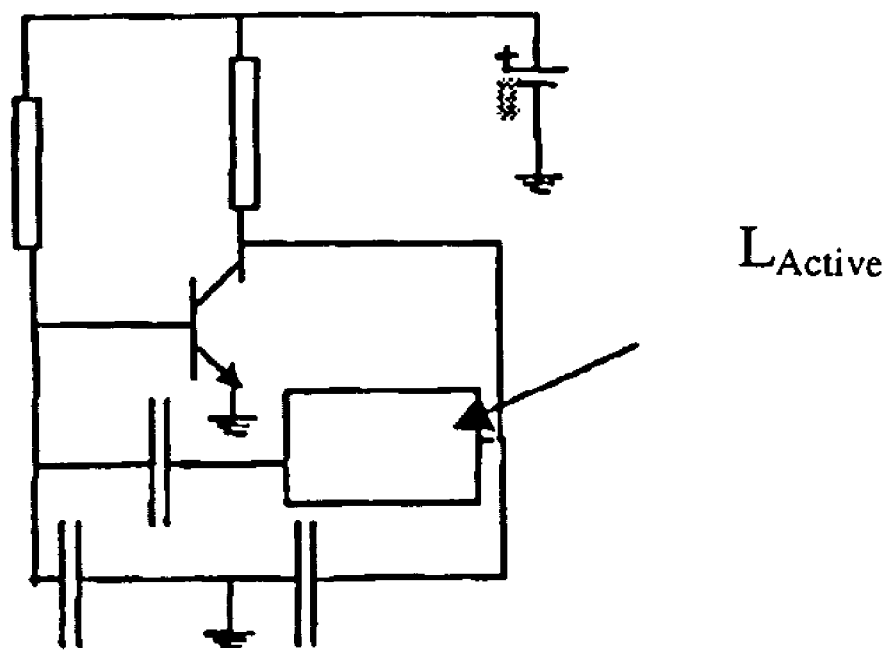
FIG. 8 depicts a Clapp oscillator which includes an active inductor.

FIG. 8 shows a third example of the second embodiment, namely a Clapp oscillator, which also include an active inductor $L_{active}$ of the present invention. The same principles discussed above with respect to the exemplary oscillator of FIG. 6 apply to the oscillators shown in FIGS. 7 and 8. Namely, inclusion of the active inductor $L_{active}$ in the oscillators depicted in FIGS. 7 and 8 readily permits tuning the oscillator frequency to a desired frequency, preferably within a range of 1–5 GHz and more preferably, within an even broader range of frequencies.

Figure 9:
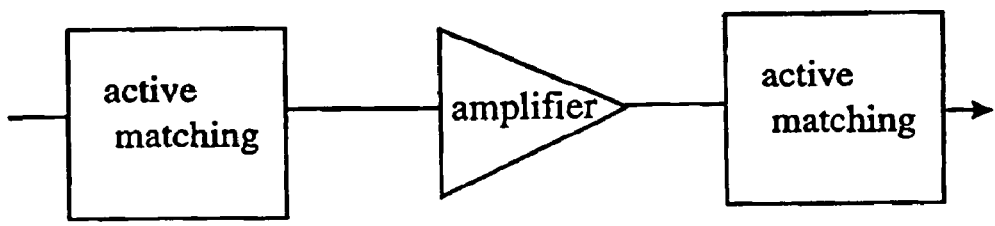
FIG. 9 shows an exemplary arrangement in block form of an adaptive amplifier according to the present invention that includes adaptive matching via active inductors.

A third embodiment of the present invention is directed to an adaptive amplifier incorporating active inductors. For an amplifier, a peaking and a matching structure could be provided either at the input or at the output, as shown in block diagram form in FIG. 9. However, it is often difficult to combine two active structures, in terms of matching one circuit to the other, without destroying the two separately obtainable effects. In this regard, an investigation of basic amplifier designs indicated that input matching poses a problem for the use of active inductance to form an adaptive amplifier. As soon as the active inductance is directly set to the input, it destroys both the gain and the matching. Therefore, a second stage must be added, as the first will be a matching buffer.

Figure 10:
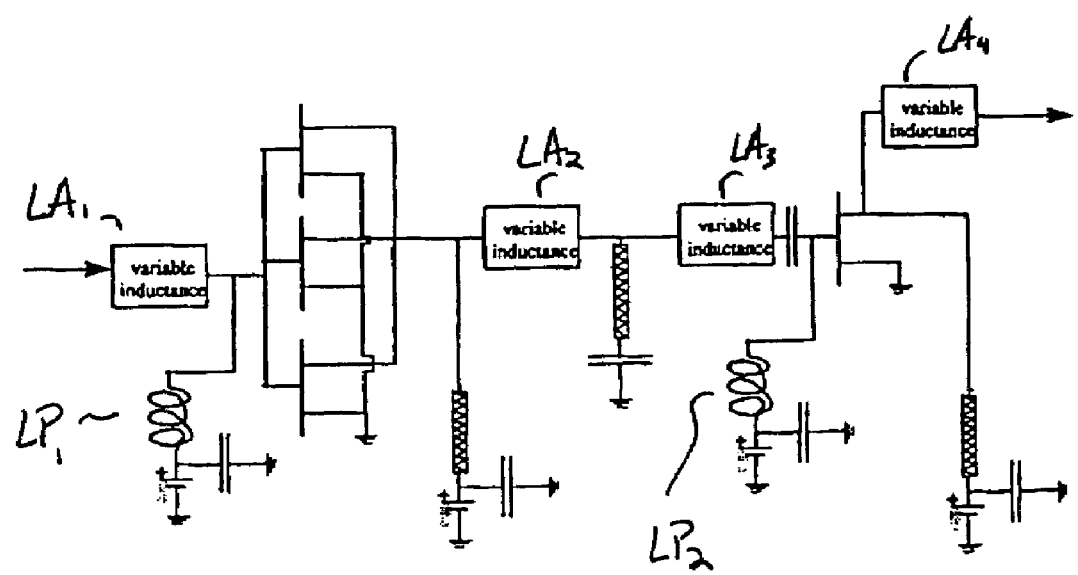
FIG. 10 illustrates a first exemplary adaptive two-stage amplifier incorporating active inductors.

An first exemplary adaptive amplifier according to the fifth embodiment is illustrated in FIG. 10. The first adaptive amplifier includes a first stage and a second stage, which are linked by active inductors. Preferably, the first stage includes three Field Effect Transistors (FET's) arranged in parallel, and the second stage includes a FET. More preferably, the FETs's are Metal Oxide Semiconductor FET's (MOSFET's), and even more preferably that the MOSFET's have a width of 300 μm (i.e., the gate of each of the MOSFET's transistors is approximately 300 μm in length). Active inductors are introduced between the two stages. The active inductors are independently controlled and therefore permit independent adjustment of their characteristics, thereby providing adaptive matching along the utilization frequency range.

Notably, the first exemplary adaptive amplifier of the third embodiment provides a straight forward solution to the above-discussed problems based upon the fact that—going from the input to the output—a first active inductor $LA_1$ plays an input matching role, a second group of active inductors $LA_2$ and $LA_3$ between the two stages provides inter-stage matching, and a fourth active inductor $LA_4$ provides output matching adjustment. More preferably, the active inductors $LA_1$, $LA_2$, $LA_3$, and $LA_4$ are bipolar-based, as this was determined to be the most efficient.

The exemplary amplifier illustrated in FIG. 10 has been analyzed and the results are presented in FIGS. 11 to 15. As shown in these figures, the active inductors $LA_1$, $LA_2$, $LA_3$, and $LA_4$ permit matching over a range from 500 MHz to 4 GHz. It should be noted that passive inductors $LP_1$ and $LP_2$ are used to affect the bias for the two stages. However, the passive inductors $LP_1$ and $LP_2$ do not appreciably affect the quality factor of the amplifier.

In order to optimize the adaptive amplifier of the third embodiment, there are at least two bias points for each of the active inductors, which complicate the optimization of the amplifier. In particular, the adaptive amplifier illustrated in FIG. 10 often could be matched at the input at a first frequency $f_1$ and at a second frequency $f_2$ on the output. Then, the matching and gain had to be systematically extracted from input to output. One possible solution is to optimize with a 50 ohm loaded second stage before introducing the last active inductor $LA_4$, thereby presenting a large matching that permits securing the values for input and output.

Figure 11:
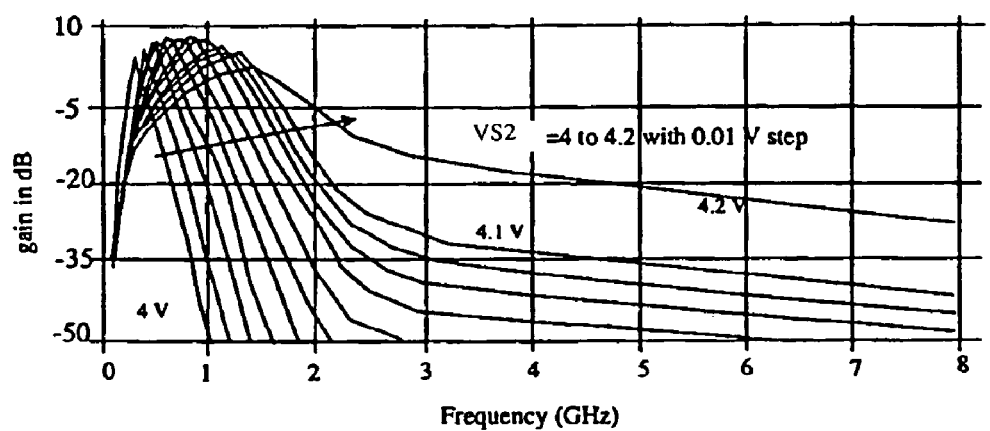
FIG. 11 shows the gain of the first exemplary adaptive amplifier as a function of frequency plotted for various values of the control voltage VS2 ranging from 4.0–4.2 V.
Figure 12:
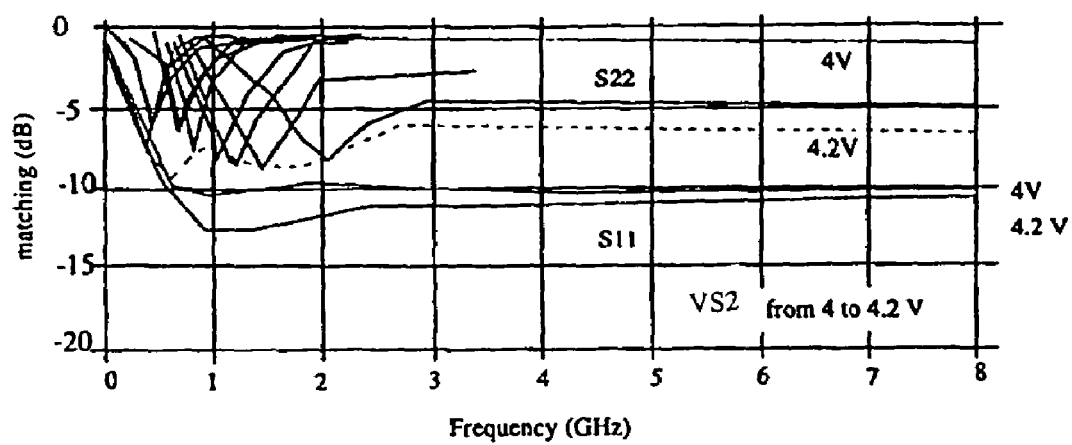
FIG. 12 shows the input and output matching transfer functions S11 and S22 for the first exemplary adaptive amplifier as a function of frequency plotted for various values of the control voltage VS2 between 4.0–4.2 V.

As shown in FIG. 11, small changes in the voltages applied to the active inductors $LA_1$–$LA_4$ in the adaptive amplifier depicted in FIG. 10 (e.g., changing VS2 from 4.0 V to 4.2 V, with a 0.01 V step, for the active inductor of FIG. 3) shift the frequency, with the gain evolving from a frequency of 0.5 GHz to 1.0 GHz. The corresponding matching is illustrated in FIG. 12 and exhibits similar tendencies. FIG. 12 shows the input and output matching transfer functions $S_{11}$ and $S_{22}$ corresponding to the two extreme values of the control voltage (i.e., VS2), namely 4.0 V and 4.2 V. As seen from the two sets of curves in FIG. 12, the input matching transfer function $S_{11}$ is relatively insensitive to the value of the control voltage VS2 within the given range of 4.0–4.2 V, due to the configuration of the adaptive amplifier of FIG. 10. In contrast, the output matching transfer function $S_{22}$ is particularly sensitive to changes in the control voltage VS2, over the range of 4.0–4.2 V. In addition, the frequency shift of the output matching transfer function $S_{22}$ is similar to that exhibited by the gain, as is evident from a comparison of FIGS. 11 and 12.

Figure 13:
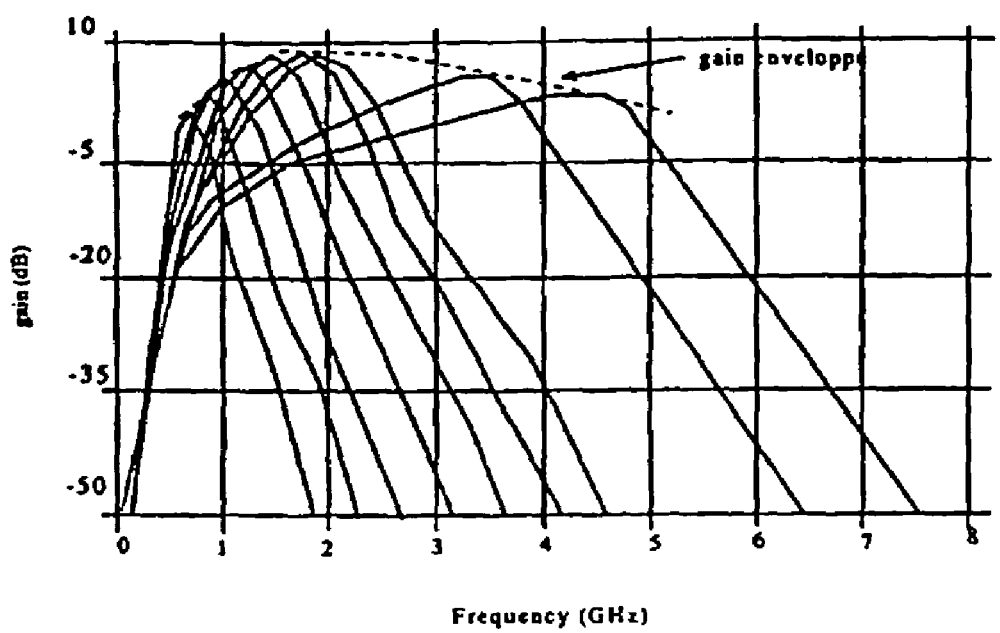
FIG. 13 illustrates the dependence of the gain on the value of the control voltage VS2, as a function of frequency.

FIG. 13 illustrates the dependence of the gain on the value of the control voltage VS2. As is evident from FIG. 13, the maximum gain is relatively insensitive to the value of the control voltage VS2. This leads to an operable range of 3 GHz plus or minus 2.5 GHz.

Changing VS4 adjusts the frequency adjustment in each of the active inductors $LA_1$–$LA_4$. For the adaptive amplifier of FIG. 10, VS4 ranges from 2.75 V (corresponding to 900 MHz) to 2.85 V (corresponding to 4 GHz).

Figure 14:
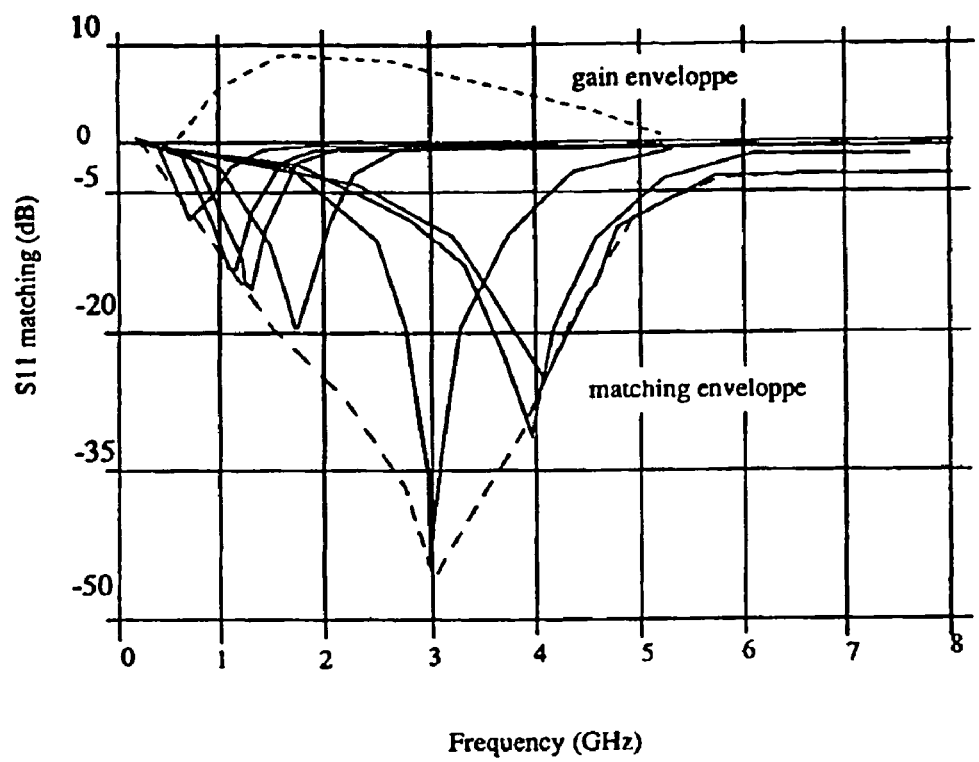
FIG. 14 superimposes the matching and gain characteristics plotted as a function of frequency.

After the control voltage VS2 is determined using an approximate value of the control voltage VS4, a fine adjustment can be made to the quality factor of each active inductor $LA_1$–$LA_4$, as shown in FIG. 14. Values of the input and output matching transfer function $S_{11}$ and $S_{22}$ 30 dB and a gain of 8 dB were attained in this manner.

As is evident from FIG. 14, in which the matching and gain characteristics are superimposed, the exemplary adaptive amplifier of FIG. 10 provides latitude to achieve a gain and filtering effect over a large frequency range.

However, a 5 GHz frequency was not attained for the exemplary adaptive amplifier of Figure because the 300 μm transistors were inadequate. However, if transistors with shorter gate lengths are used, it may be possible to reach the upper frequency range.

The gain exhibited in the exemplary adaptive amplifier of FIG. 10 is inherent to the amplifier structure and the number of stages. Thus, if more gain is desired, it can be attained by adjusting the structure and/or number of stages.

Figure 15:
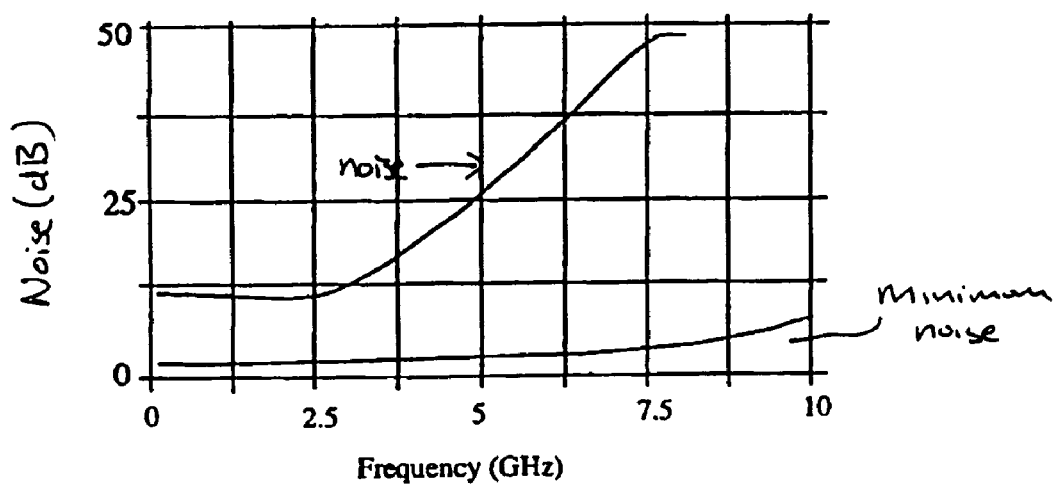
FIG. 15 shows the noise and the minimum noise as a function of frequency, for the adaptive amplifier depicted in FIG. 10.

FIG. 15 shows the noise characteristics of the exemplary adaptive amplifier of FIG. 10. As seen from FIG. 15, the noise performance of the adaptive amplifier of FIG. 10 is worse than that of a passive device structure. The voltage VS2 controls the quality factor, which unfortunately provides a direct link between devices and thus increases the overall noise in the system, by a minimum of 10 dB.

Figure 16:
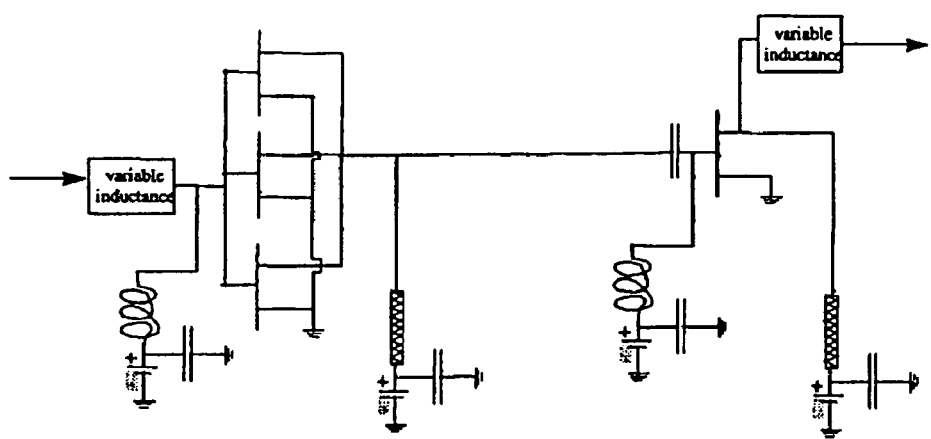
FIG. 16 illustrates a second exemplary adaptive amplifier including active inductance.

A second exemplary adaptive amplifier according to the third embodiment is illustrated in FIG. 16. Notably, the second exemplary amplifier possesses a simplified configuration relative to the first exemplary amplifier, in that only the input and the output are matched via active inductors $LA_{in}$ and $LA_{out}$. As with the first amplifier, the second amplifier may include two or more stages, depending on the desired gain. The exemplary amplifier depicted in FIG. 16 includes two stages, with the first stage preferably including 300 μm MOSFET's and the second stage preferably including a 100 μm MOSFET.

Figure 17:
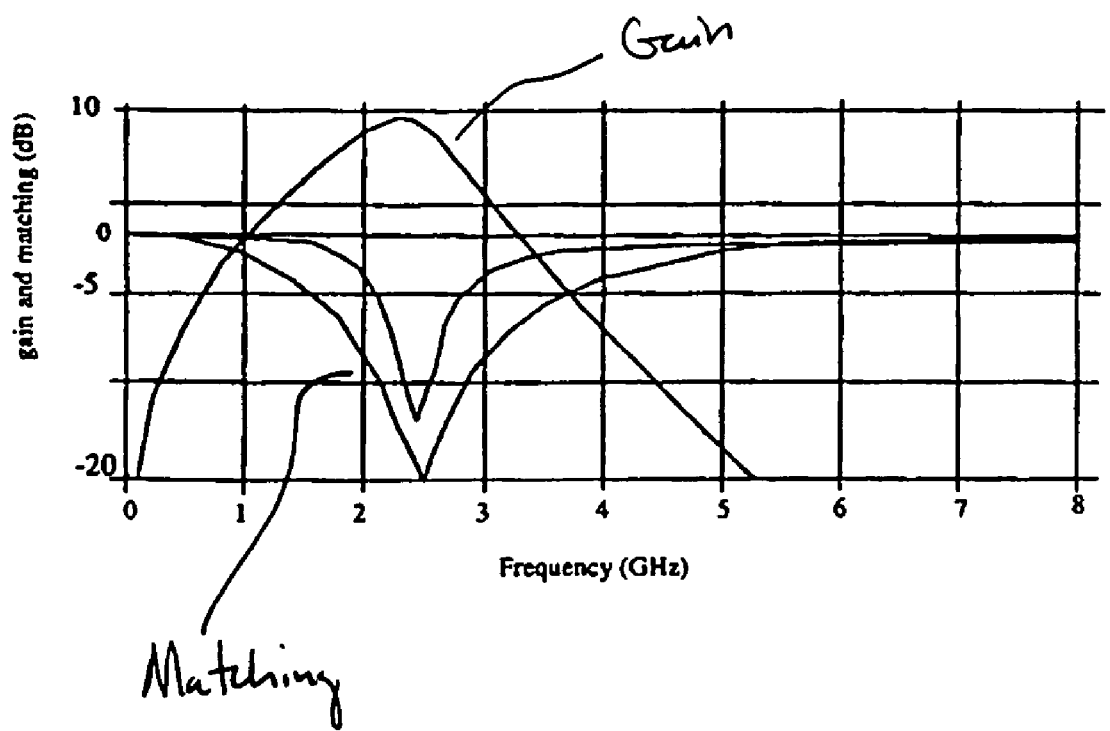
FIG. 17 shows the gain and matching, of the adaptive amplifier depicted in FIG. 16, as a function of frequency and plotted for optimal control voltages.
Figure 18:
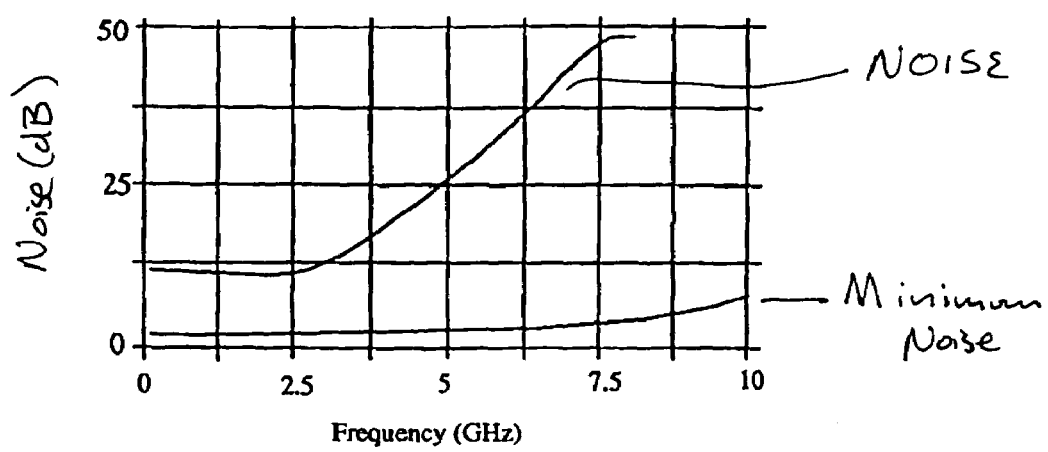
FIG. 18 shows the noise for the adaptive amplifier depicted in FIG. 16.

FIG. 17 shows the gain and matching for the exemplary adaptive amplifier of FIG. 16, for a first set of control voltages in the active inductors $LA_{in}$ and $LA_{out}$. The results illustrated in FIG. 17 correspond to a refined adjustment having a gain of 10 that is centered on the 2.4 GHz ISM band and providing matching better than 15 dB. FIG. 18 depicts the noise for this configuration. As seen from FIG. 18, the noise is about 11 dB. Moreover, results similar to those shown in FIG. 17 were obtained at different frequencies such as 0.9 GHz and 3 GHz.

Figure 19:
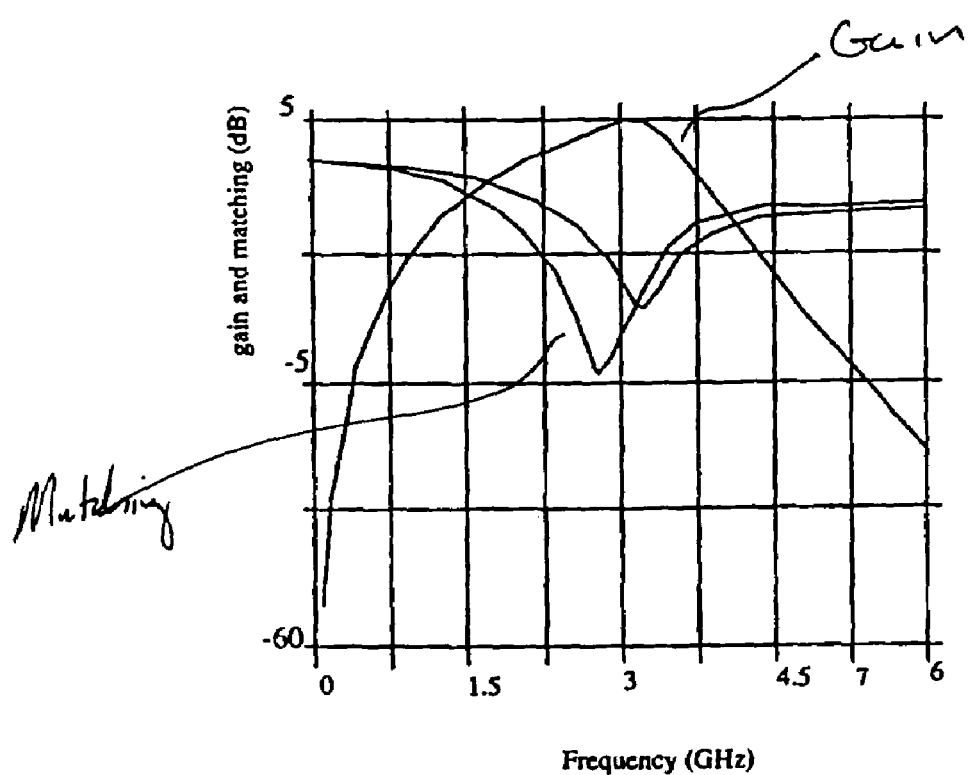
FIG. 19 shows the gain and the matching of the adaptive amplified depicted in FIG. 16 for a second set of control voltages.

As shown in FIG. 19, the gain and matching were determined for the exemplary adaptive amplifier of FIG. 16 for a second set of control voltages. The second set of control voltages produced a gain and matching that were centered around a frequency of 3 GHz. As seen from FIG. 19, the gain is lower relative to that shown in FIG. 17 due essentially to the behavior of the 300 μm MOSFET's used in the first stage. However, the 5 dB matching shown in FIG. 19 is superior to the 15 dB matching of FIG. 17.

Generally, the second exemplary adaptive amplifier is advantageous in that it provides a stand-alone filtering amplifier with a broadband range of accord. The second amplifier also provides good stability, as its configuration has been evaluated with respect to stability in the case of passive inductors.

Figure 20:
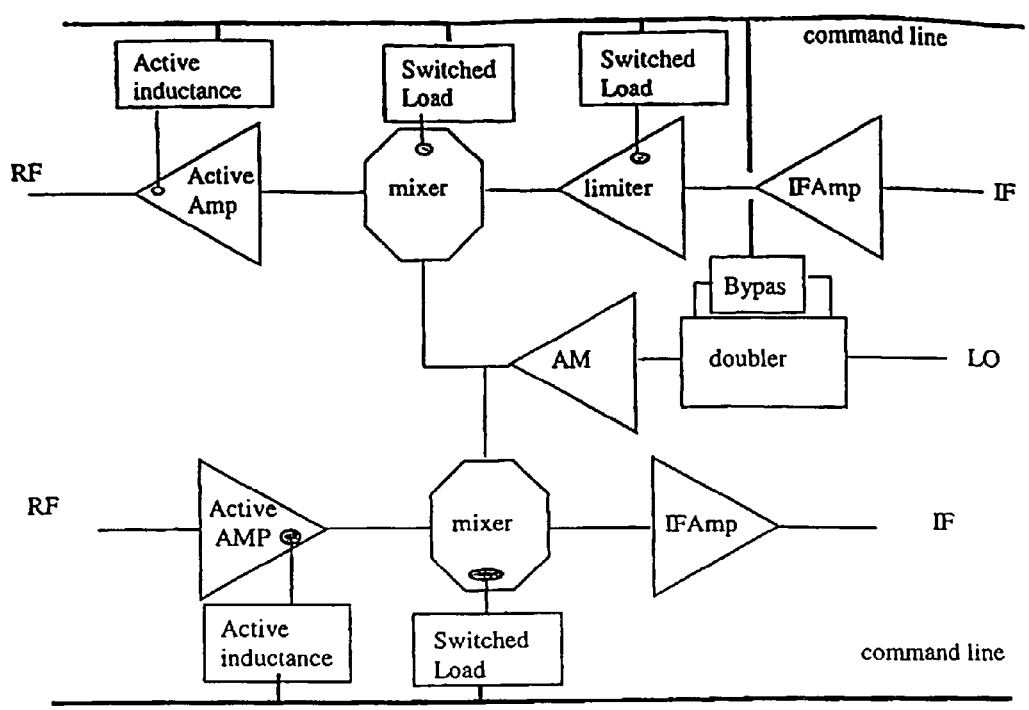
FIG. 20 shows an improved transceiver incorporating active inductors and MOS load switching.

A fourth embodiment of the present invention provides a transceiver for automatic reconfiguration for a multimode application. As shown in FIG. 20, the transceiver includes in the receiving path an RF amplifier, a down mixer, and an IF amplifier. In the transmitting path, the transceiver includes an IF amplifier, a limiting amplifier, an up mixer, and an RF amplifier. The local oscillator is provided through a buffer amplifier and a doubler to the mixer. As shown in FIG. 20, to achieve a multi-frequency feature, the transceiver employs MOS load switching for the mixers and limiters and active inductors in the RF amplifiers. All the adjustable elements are tuned by a common line bus addressing different voltages to the different circuits.

In a preferred embodiment, the transceiver employs MOS load switching for the mixers and limiters. In addition, the transceiver preferably uses a MOSFET as a typical switch to bypass a signal path, typically in the doubler.

Figure 21:
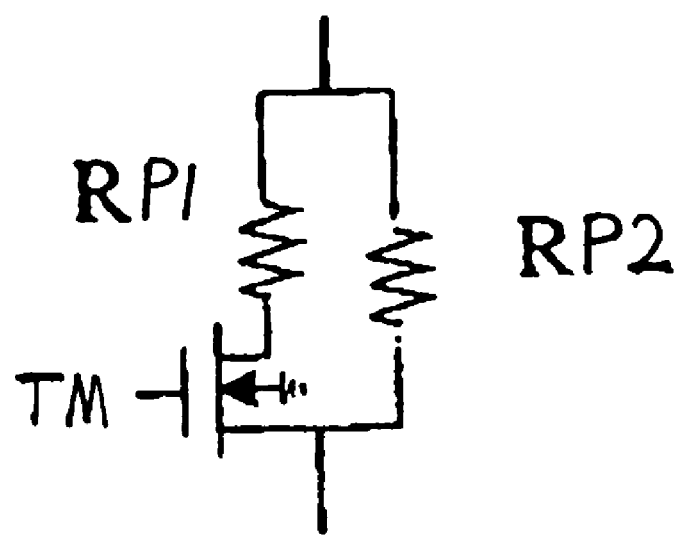
FIG. 21 depicts a MOS load switch.

In many circuits, operation at different frequencies requires changing the load values. The present invention uses a MOSFET to provide load switching for such circuits. Because a MOSFET isolates the gate from the source-drain path through its relatively high input impedance, a MOSFET can be utilized to provide a variable load to a circuit. The present invention exploits this characteristic of MOSFET's to provide a variable load. Preferably, a passive load $RP_1$ and a MOSFET TM are connected in series, and these elements are connected in parallel with another load $RP_2$, as shown in FIG. 21.

Advantageously, a continuous change in resistance can be achieved by varying the gate voltage. Consequently, the MOSFET can be modeled by different values of equivalent resistors, typically from 2 to 3 Ohms to several kOhms, over a short range of gate voltages. To achieve an active load, this range can be fully exploited.

Figure 22:
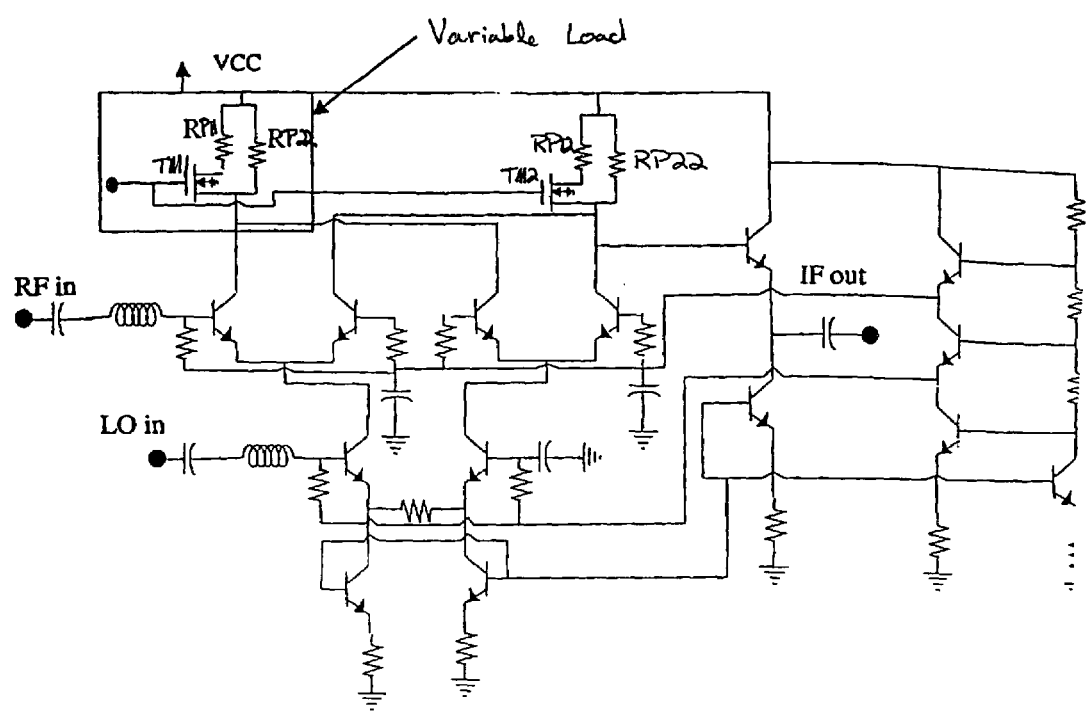
FIG. 22 shows a mixer and a switched load.

Preferably, the mixer comprises the structure illustrated in FIG. 22. The mixer has a dual differential structure in which the bias voltages are provided by a voltage ladder. The output is directly connected to an emitter follower buffer stage. To maximize the mixer's versatility, an active load is incorporated. As shown in FIG. 22, the active load includes a MOSFET, which is connected in series with a resistor RP1. The active load further includes a resistor RP2, which is connected in parallel with the MOS and resistor RP1. The load of the mixer is adjusted through the control voltage Vcc.

Significantly, the use of an active load is advantageous, in that the single voltage supply and bias conditions of the lowest stages of the mixer structure need not be modified. In addition, adjusting the active load does not appreciably perturb the mixer core, as the gate and source/drain are naturally isolated. However, for this design, good characterization of the MOSFET is essential for optimization of the different values of resistors.

A first optimization was performed to extract the maximum gain in the 2 GHz and 5 GHz frequency regimes. For this example, the resistor values were fixed to 1400 ohms for the resistor RP1 and 2000 ohms for the resistor RP2. For 2.4 GHz and 5 GHz, the mixer provided an average conversion gain of 8 dB and 5 dB, respectively, for a local oscillator power of −5 dBm, at an input power of −50 dBm to the intermediate frequency amplifier, in a frequency range of 200 MHz to 700 MHz. At 5 V, the exemplary mixer had a current consumption of 5 mA.

The conversion gain for the exemplary mixer can be changed by more than 20 dB, by changing the gate voltages of the MOSFET. In addition, the input 1 dB compression point, at the maximum conversion gain, is −20 dBm for the 2.4 GHz case and −12 dBm for the 5 GHz case.

Figure 25:
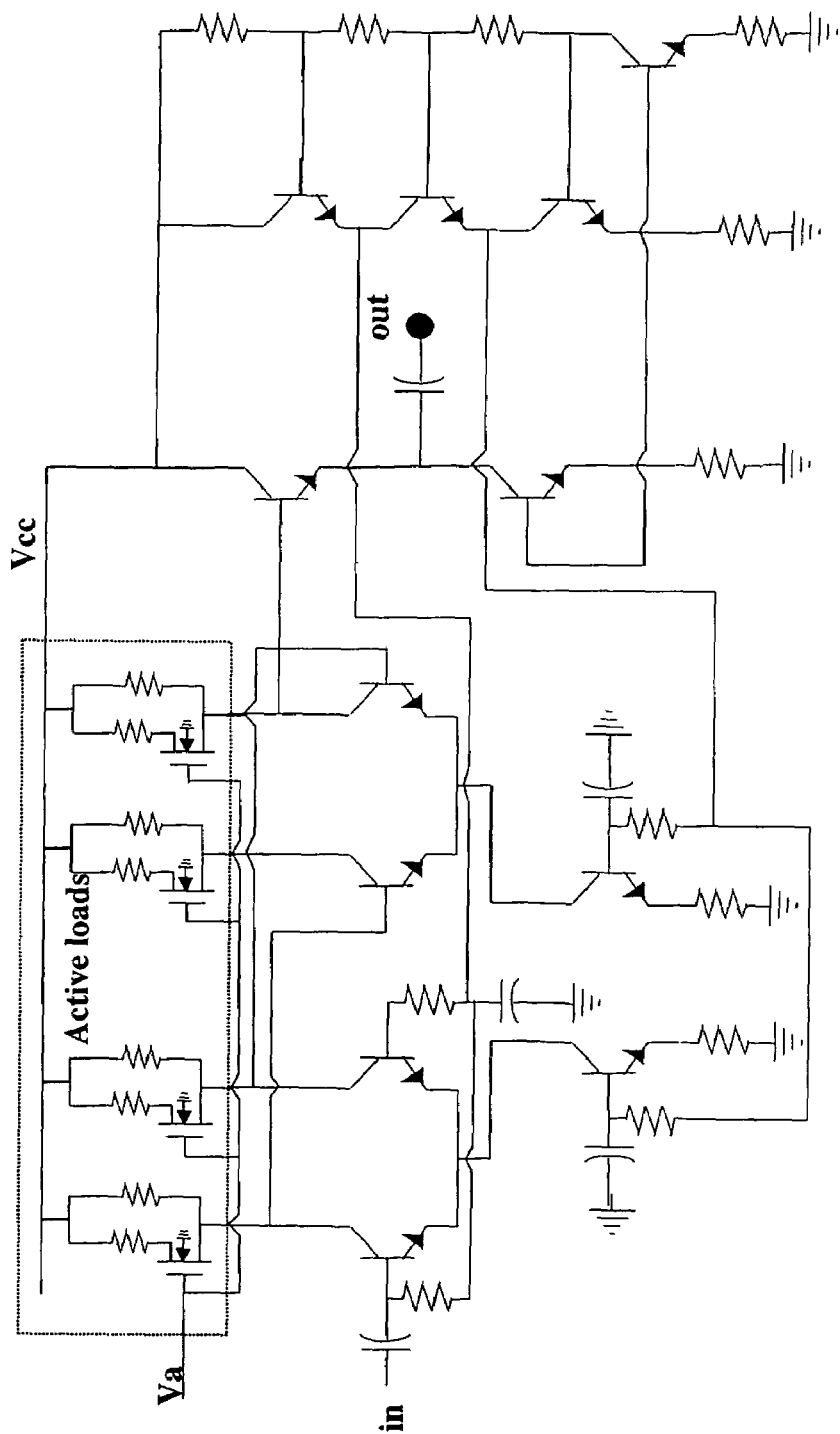
FIG. 25 show a limiter with active loads.

Preferably, the limiter comprises the structure illustrated in FIG. 25. The MOSFET load switch circuit changes the gain and therefore determines the limit of the 1-dB gain compression point. The gain of the exemplary limiter can vary from −15 dB to 17 dB over 100 MHz to 700 MHz. The exemplary limiter can be used as a simple amplifier or as a limiter upon request from a base-band control on the gate of the MOSFET's. The power consumption of the exemplary limiter is 5 mA at 4 V.

Figure 23:
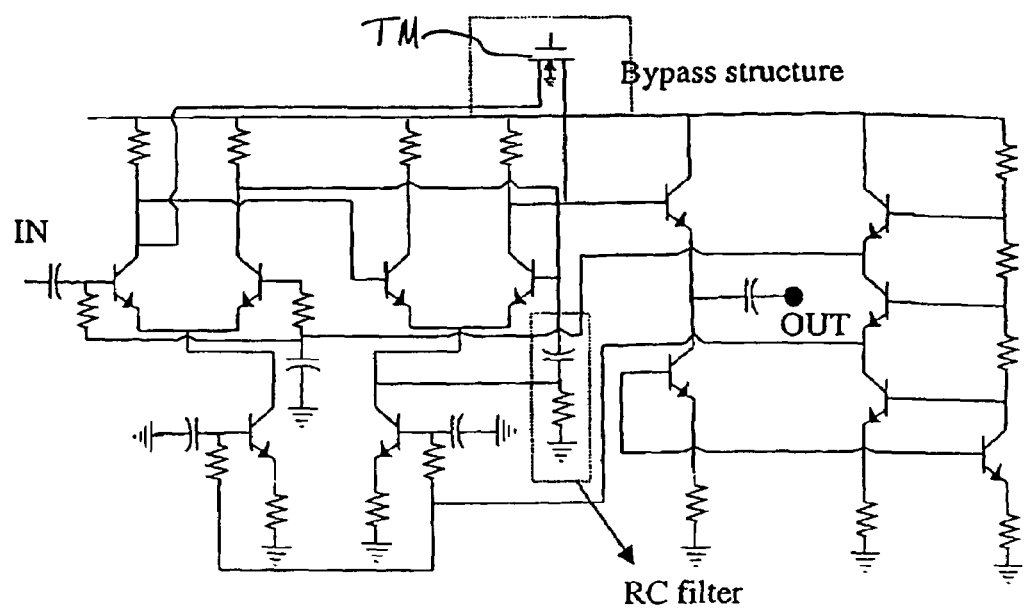
FIG. 23 depicts a doubler with a MOS bypass structure.
Figure 24:
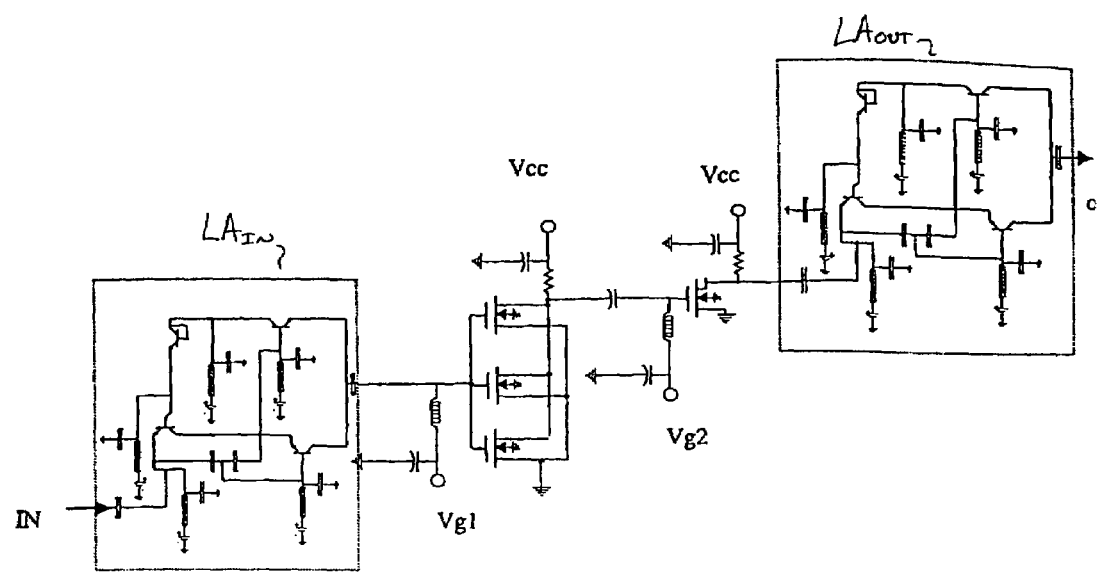
FIG. 24 shows an adaptive matched amplifier incorporating active inductors.

A preferred doubler for use in the transceiver is illustrated in FIG. 23. As shown in FIG. 23, the preferred doubler circuit includes a by-pass switching feature. For the preferred transceiver configuration of FIG. 20, a local oscillator is used for the 2.4 GHz operations, to activate the doubler to give an output for 5 GHz operation. Although several positions were tested, the position of the bypass structure is constrained by the dual optimization required to permit the circuit to as a doubler and also as an amplifier. In addition, the MOSFET must be carefully selected, as it will create a loss in the current path.

When functioning as a doubler, the circuit's conversion gain can vary from −20 dB to 2 dB, and the current consumption is 5 mA at 4 V. For the preferred doubler circuit of FIG. 23, the gain for the doubler can be turned off by applying a certain gate voltage to the MOS by-pass structure, such that the circuit functions as an amplifier. When functioning as an amplifier, the gain for the exemplary circuit of FIG. 5 is between −7 to 1 dB, at a 2 GHz input.

An adaptive amplifier for use in the transceiver is illustrated in FIG. 6, in a simplified form. The exemplary adaptive amplifier includes a first stage and a second stage. Preferably, the two stages include MOSFET's, and more preferably the first and second stage MOSFET's have 500 μm and 200 μm gates, respectively. Active inductors are positioned on the input and output of the two stages, to provide input and output matching. This structure provides considerable versatility, as the active inductors are independently controlled and therefore permit independent adjustment of their characteristics. Consequently, input and output matching can be performed over a wide range of frequencies, for the exemplary adaptive amplifier. The exemplary adaptive amplifier has a gain of 10 dB, and the matching is adjustable better than 7 dB over a frequency range from 0.9 GHz to 4.5 GHz. The current consumption is 12 mA for a supply voltage of 3–4 V.

Using the exemplary mixer, doubler, adaptive amplifier, and limiter illustrated in FIGS. 22–25, the transceiver of FIG. 20 operated under 4 V with a maximum power dissipation of 90 mW and 100 mW in the receiving and transmitting modes, respectively. The overall conversion gains varied from 17 dB to 40 dB, depending on the adjustments of the active elements.

The above description of the preferred embodiments has been given by way of example. From the disclosure given those skilled in the art will not only understand the present invention and its attendant advantages, but will also find apparent various changes and modifications to the structures disclosed. For example, although FIG. 3 depicts the constituent circuit elements being directly connected to one another, one skilled in the art would readily recognize that an equivalent circuit can be achieved by electrical connections between the constituent elements via other circuit elements not pictured, so long as the additional circuit elements do not appreciably degrade the device's performance. It is sought, therefore, to cover all such changes and modifications as fall within the spirit and scope of the invention, as defined by the appended claims, and equivalent thereof.

What is claimed is:

1. A mixer having a first input comprising a first frequency $f_1$ and a second input comprising a second frequency $f_2$, said mixer comprising:

mixing means for mixing the first and second inputs to produce an output having an additive frequency component $f_+$ and a difference frequency component $f_-$, where:

$$f_+ = f_1 + f_2,$$

$f_-$ = absolute value $(f_1 - f_2)$; and an active inductive load comprising Field Effect Transistors (FET), wherein said active inductive load is electrically connected to said mixing means and provides a variable load on said mixing means, wherein a base of one of said FETs is connected to two capacitors, and wherein said active inductive load further comprises a FET diode.

2. A mixer according to claim 1, wherein said FETs comprise MOSFETs.

3. A transceiver comprising:

a first adaptive amplifier having an output comprising a first frequency $f_1$, said amplifier comprising amplification means and active matching means for providing active matching at an input and output of said amplification means;

a first mixer having a first input comprising the output of said adaptive amplifier and a second input comprising a reference signal having a reference frequency $f_2$, said mixer comprising:

mixing means for mixing the first and second inputs to produce an output having an additive frequency component $f_+$ and a difference frequency component $f_-$, where:

$$f_+ = f_1 + f_2,$$

$f_-$ = absolute value $(f_1 - f_2)$, and active inductive load means for providing a variable load on said mixing means, wherein said means comprises a FET having a base connected to two capacitors, and wherein said means further comprise an FET diode; and a first intermediate frequency amplifier, wherein the output of said first mixer is input to said first intermediate frequency amplifier.

4. A transceiver according to claim 3, further comprising:

a second intermediate frequency amplifier having an output;

a limiter having an output comprising a third frequency $f_3$, said limiter comprising a first active inductive load means for providing a variable load;

a second mixer having a first input comprising the output of said limiter and a second input comprising the reference signal with frequency $f_2$, said mixer comprising:

mixing means for mixing the first and second inputs to produce an output having an additive frequency component $f_+$ and a difference frequency component $f_-$, where:

$$f_+ = f_3 + f_2,$$

$f_-$ = absolute value $(f_3 - f_2)$, and a second active inductive load means for providing a variable load on said mixing means; and a second adaptive amplifier comprising amplification means and active matching means for providing active matching at an input and output of said amplification means, wherein the output of said second intermediate frequency amplifier is input to said limiter, and the output of said second mixer is input to said second adaptive amplifier.

5. A transceiver according to claim 4, further comprising:

a doubler having an output and comprising:

doubling means for outputting an output frequency which is double an input frequency, and an active by-pass switch comprising a Field Effect Transistor (FET) and by-passing said doubling means upon application of a switching gate voltage to said FET causing the output frequency to be equal to the input frequency; and a buffer amplifier outputting the reference signal having the reference frequency $f_2$ to said first and second mixers, wherein the output of said doubler is input to said buffer amplifier.

6. A transceiver comprising:

an intermediate frequency amplifier having an output;

a limiter having an output comprising a first frequency $f_1$, said limiter comprising a first active inductive load means for providing a variable load, wherein said first active inductive load comprises one FET having a base connected to two capacitors, and wherein said first active inductive load further comprises a FET diode;

a mixer having a first input comprising the output of said limiter and a second input comprising a reference frequency $f_2$, said mixer comprising:

mixing means for mixing the first and second inputs to produce an output having an additive frequency component $f_+$ and a difference frequency component $f_-$, where:

$f_+ = f_1 + f_2$, $f_- =$ absolute value $(f_1 - f_2)$, and a second active inductive load means for providing a variable load on said mixing means; and an adaptive amplifier comprising amplification means and active matching means for providing active matching at an input and output of said amplification means, wherein the output of said intermediate frequency amplifier is input to said limiter, and the output of said mixer is input to said adaptive amplifier.

7. A mixer having a first input comprising a first frequency $f_1$ and a second input comprising a second frequency $f_2$, said mixer comprising:

a mixer circuit which mixes the first and second inputs to produce an output having an additive frequency component $f_+$ and a difference frequency component $f_-$, where:

$f_+ = f_1 + f_2$, $f_- =$ absolute value $(f_1 - f_2)$; and an active inductive load comprising Field Effect Transistors (FET), wherein said active inductive load is electrically connected to said mixer circuit and provides a variable load on said mixing means, and wherein a base of one of said FETs is connected to two capacitors, and wherein said active inductive load further comprises a FET diode.

8. A mixer according to claim 7, wherein said FETs comprise MOSFETs.

9. A transceiver comprising:

a first adaptive amplifier having an output comprising a first frequency $f_1$, said amplifier comprising an amplifier circuit and an active matching circuit which provides active matching at an input and output of said amplifier circuit;

a first mixer having a first input comprising the output of said adaptive amplifier and a second input comprising a reference signal having a reference frequency $f_2$, said mixer comprising:

a mixer circuit which mixes the first and second inputs to produce an output having an additive frequency component $f_+$ and a difference frequency component $f_-$, where:

$f_+ = f_1 + f_2$, $f_- =$ absolute value $(f_1 - f_2)$, and an active inductive load which provides a variable load on said mixer circuit, wherein said active inductive load comprises one FET having a base connected to two capacitors, and wherein said active inductive load further comprises a FET diode; and a first intermediate frequency amplifier, wherein the output of said first mixer is input to said first intermediate frequency amplifier.

10. A transceiver according to claim 9, further comprising:

a second intermediate frequency amplifier having an output;

a limiter having an output comprising a third frequency $f_3$, said limiter comprising a first active inductive load for providing a variable load;

a second mixer having a first input comprising the output of said limiter and a second input comprising the reference signal with frequency $f_2$, said mixer comprising:

a mixer circuit which mixes the first and second inputs to produce an output having an additive frequency component $f_+$ and a difference frequency component $f_-$, where:

$f_+ = f_3 + f_2$, $f_- =$ absolute value $(f_3 - f_2)$, and a second active inductive load which provides a variable load on said mixer circuit; and a second adaptive amplifier comprising an amplifier circuit and an active matching circuit for providing active matching at an input and output of said amplifier circuit, wherein the output of said second intermediate frequency amplifier is input to said limiter, and the output of said second mixer is input to said second adaptive amplifier.

11. A transceiver according to claim 10, further comprising:

a doubler having an output and comprising:

a doubler circuit which outputs an output frequency which is double an input frequency, and an active by-pass switch comprising a Field Effect Transistor (FET) and by-passing said doubler circuit upon application of a switching gate voltage to said FET causing the output frequency to be equal to the input frequency; and a buffer amplifier outputting the reference signal having the reference frequency $f_2$ to said first and second mixers, wherein the output of said doubler is input to said buffer amplifier.

12. A transceiver according to claim 6 or 11,
wherein the active by-pass switch comprises a MOSFET.

13. A transceiver according to claim 9 or 10,
wherein at least one of said active inductive load, said first active inductive load, and said second active inductive load comprises FETs.

14. A transceiver according to claim 9 or 10,
wherein at least one of said active inductive load, said first active inductive load, and said second active inductive load comprises MOSFETs.

15. A transceiver comprising:
an intermediate frequency amplifier having an output;
a limiter having an output comprising a first frequency $f_1$, said limiter comprising first active inductive load circuit for providing a variable load, and wherein said first active inductive load comprises one FET having a base connected to two capacitors, and wherein said first active inductive load further comprises a FET diode;
a mixer having a first input comprising the output of said limiter and a second input comprising a reference frequency $f_2$, said mixer comprising:
a mixer circuit which mixes the first and second inputs to produce an output having an additive frequency component $f_+$ and a difference frequency component $f_-$, where:

$f_+ = f_1 + f_2$, $f_- =$ absolute value $(f_1 - f_2)$, and a second active inductive load which provides a variable load on said mixer circuit; and
an adaptive amplifier comprising an amplifier circuit and an active matching circuit which provides active matching at an input and output of said amplifier circuit,
wherein the output of said intermediate frequency amplifier is input to said limiter, and the output of said mixer is input to said adaptive amplifier.

16. A transceiver according to claim 15,
wherein at least one of said first active inductive load and said second active inductive load comprises FETs.

17. A transceiver according to claim 15,
wherein at least one of said first active inductive load and said second active inductive load comprises MOSFETs.

18. A transceiver comprising:
a first adaptive amplifier having an output comprising a first frequency $f_1$, said amplifier comprising amplification means and active matching means for providing active matching at an input and output of said amplification means;
a first mixer having a first input comprising the output of said adaptive amplifier and a second input comprising a reference signal having a reference frequency $f_2$, said mixer comprising:
mixing means for mixing the first and second inputs to produce an output having an additive frequency component $f_+$ and a difference frequency component $f_-$, where:

$f_+ = f_1 + f_2$, $f_- =$ absolute value $(f_1 - f_2)$, and a first active load means for providing a variable load on said mixing means;
a first intermediate frequency amplifier,
wherein the output of said first mixer is input to said first intermediate frequency amplifier;
a second intermediate frequency amplifier having an output;
a limiter having an output comprising a third frequency $f_3$, said limiter comprising a second active load means for providing a variable load;
a second mixer having a first input comprising the output of said limiter and a second input comprising the reference signal with frequency $f_2$, said mixer comprising:
mixing means for mixing the first and second inputs to produce an output having an additive frequency component $f_+$ and a difference frequency component $f_-$, where:

$f_+ = f_3 + f_2$, $f_- =$ absolute value $(f_3 - f_2)$, and a third active load means for providing a variable load on said mixing means;
a second adaptive amplifier comprising amplification means and active matching means for providing active matching at an input and output of said amplification means,
wherein the output of said second intermediate frequency amplifier is input to said limiter, and the output of said second mixer is input to said second adaptive amplifier;
a doubler having an output and comprising:
doubling means for outputting an output frequency which is double an input frequency, and
an active by-pass switch comprising a Field Effect Transistor (FET) and by-passing said doubling means upon application of a switching gate voltage to said FET causing the output frequency to be equal to the input frequency; and
a buffer amplifier outputting the reference signal having the reference frequency $f_2$ to said first and second mixers,
wherein the output of said doubler is input to said buffer amplifier.

19. A transceiver comprising:
a first adaptive amplifier having an output comprising a first frequency $f_1$, said amplifier comprising an amplifier circuit and an active matching circuit which provides active matching at an input and output of said amplifier circuit;
a first mixer having a first input comprising the output of said adaptive amplifier and a second input comprising a reference signal having a reference frequency $f_2$, said mixer comprising:
a mixer circuit which mixes the first and second inputs to produce an output having an additive frequency component $f_+$ and a difference frequency component $f_-$, where:

$f_+ = f_1 + f_2$, $f_- =$ absolute value $(f_1 - f_2)$, and a first active load which provides a variable load on said mixer circuit;
a first intermediate frequency amplifier,
wherein the output of said first mixer is input to said first intermediate frequency amplifier;

a second intermediate frequency amplifier having an output;
a limiter having an output comprising a third frequency $f_3$, said limiter comprising a second active load for providing a variable load;
a second mixer having a first input comprising the output of said limiter and a second input comprising the reference signal with frequency $f_2$, said mixer comprising:
a mixer circuit which mixes the first and second inputs to produce an output having an additive frequency component $f_+$ and a difference frequency component $f_-$, where:

$f_+ = f_3 + f_2$, $f_-$ = absolute value $(f_3 - f_2)$, and a third active inductive load which provides a variable load on said mixer circuit;
a second adaptive amplifier comprising an amplifier circuit and an active matching circuit for providing active matching at an input and output of said amplifier circuit,
wherein the output of said second intermediate frequency amplifier is input to said limiter, and the output of said second mixer is input to said second adaptive amplifier;
a doubler circuit which outputs an output frequency which is double an input frequency, and
an active by-pass switch comprising a Field Effect Transistor (FET) and by-passing said doubler circuit upon application of a switching gate voltage to said FET causing the output frequency to be equal to the input frequency; and
a buffer amplifier outputting the reference signal having the reference frequency $f_2$ to said first and second mixers,
wherein the output of said doubler is input to said buffer amplifier.

20. A transceiver comprising:
a first adaptive amplifier having an output comprising a first frequency $f_1$, said amplifier comprising amplification means and active matching means for providing active matching at an input and output of said amplification means;
a first mixer having a first input comprising the output of said adaptive amplifier and a second input comprising a reference signal having a reference frequency $f_2$, said mixer comprising:
mixing means for mixing the first and second inputs to produce an output having an additive frequency component $f_+$ and a difference frequency component $f_-$, where:

$f_+ = f_1 + f_2$, $F_-$ = absolute value $(f_1 - f_2)$, and active inductive load means for providing a variable load on said mixing means; and
a first intermediate frequency amplifier,
wherein the output of said first mixer is input to said first intermediate frequency amplifier;
a second intermediate frequency amplifier having an output;
a limiter having an output comprising a third frequency $f_3$, said limiter comprising a first active inductive load means for providing a variable load;
a second mixer having a first input comprising the output of said limiter and a second input comprising the reference signal with frequency $f_2$, said mixer comprising:
mixing means for mixing the first and second inputs to produce an output having an additive frequency component $f_+$ and a difference frequency component $f_-$, where:

$f_+ = f_3 + f_2$, $f_-$ = absolute value $(f_3 - f_2)$, and a second active inductive load means for providing a variable load on said mixing means; and
a second adaptive amplifier comprising amplification means and active matching means for providing active matching at an input and output of said amplification means,
wherein the output of said second intermediate frequency amplifier is input to said limiter, and the output of said second mixer is input to said second adaptive amplifier;
a doubler having an output and comprising:
doubling means for outputting an output frequency which is double an input frequency, and
an active by-pass switch comprising a Field Effect Transistor (FET) and by-passing said doubling means upon application of a switching gate voltage to said FET causing the output frequency to be equal to the input frequency; and
a buffer amplifier outputting the reference signal having the reference frequency $f_2$ to said first and second mixers,
wherein the output of said doubler is input to said buffer amplifier.

21. A transceiver comprising:
a first adaptive amplifier having an output comprising a first frequency $f_1$, said amplifier comprising an amplifier circuit and an active matching circuit which provides active matching at an input and output of said amplifier circuit;
a first mixer having a first input comprising the output of said adaptive amplifier and a second input comprising a reference signal having a reference frequency $f_2$, said mixer comprising:
a mixer circuit which mixes the first and second inputs to produce an output having an additive frequency component $f_+$ and a difference frequency component $f_-$, where:

$f_+ = f_1 + f_2$, $f_-$ = absolute value $(f_1 - f_2)$, and an active inductive load which provides a variable load on said mixer circuit; and
a first intermediate frequency amplifier,
wherein the output of said first mixer is input to said first intermediate frequency amplifier;
a second intermediate frequency amplifier having an output;
a limiter having an output comprising a third frequency $f_3$, said limiter comprising a first active inductive load for providing a variable load;
a second mixer having a first input comprising the output of said limiter and a second input comprising the reference signal with frequency $f_2$, said mixer comprising:

a mixer circuit which mixes the first and second inputs to produce an output having an additive frequency component $f_+$ and a difference frequency component $f_-$, where:

$$f_+ = f_3 + f_2,$$

$f_-$ = absolute value $(f_3 - f_2)$, and a second active inductive load which provides a variable load on said mixer circuit; and a second adaptive amplifier comprising an amplifier circuit and an active matching circuit for providing active matching at an input and output of said amplifier circuit, wherein the output of said second intermediate frequency amplifier is input to said limiter, and the output of said second mixer is input to said second adaptive amplifier;

a doubler having an output and comprising:

a doubler circuit which outputs an output frequency which is double an input frequency, and an active by-pass switch comprising a Field Effect Transistor (FET) and by-passing said doubler circuit upon application of a switching gate voltage to said FET causing the output frequency to be equal to the input frequency; and a buffer amplifier outputting the reference signal having the reference frequency $f_2$ to said first and second mixers, wherein the output of said doubler is input to said buffer amplifier.

22. A transceiver according to claim 20 or 21, wherein the active by-pass switch comprises a MOSFET.

* * * * *